US010714667B2

(12) United States Patent
Noh et al.

(10) Patent No.: US 10,714,667 B2
(45) Date of Patent: Jul. 14, 2020

(54) METHOD OF MANUFACTURING LIGHT EMITTING DEVICE

(71) Applicant: Samsung Electronics Co., Ltd., Suwon-si (KR)

(72) Inventors: Hye Seok Noh, Suwon-si (KR); Young Jin Choi, Seoul (KR); Yong Il Kim, Seoul (KR); Han Kyu Seong, Seoul (KR); Dong Gun Lee, Hwaseong-si (KR); Jin Sub Lee, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 44 days.

(21) Appl. No.: 16/020,071

(22) Filed: Jun. 27, 2018

(65) Prior Publication Data

US 2019/0181316 A1    Jun. 13, 2019

(30) Foreign Application Priority Data

Dec. 7, 2017   (KR) .......................... 10-2017-0167590

(51) Int. Cl.
*H01L 33/00* (2010.01)
*H01L 33/62* (2010.01)
(Continued)

(52) U.S. Cl.
CPC ............ *H01L 33/62* (2013.01); *H01L 27/156* (2013.01); *H01L 33/0095* (2013.01);
(Continued)

(58) Field of Classification Search
CPC ......... H01L 33/26; H01L 33/40; H01L 33/50; H01L 33/507; H01L 33/56; H01L 33/62;
(Continued)

(56) References Cited

U.S. PATENT DOCUMENTS 6,372,608 B1    4/2002  Shimoda et al.
6,645,830 B2   11/2003  Shimoda et al.
(Continued)

FOREIGN PATENT DOCUMENTS

EP           2439517 B1    4/2015
JP       2005-049131 A    2/2005
(Continued)

*Primary Examiner* — Monica D Harrison
(74) *Attorney, Agent, or Firm* — Muir Patent Law, PLLC

(57) ABSTRACT

A method of manufacturing a light emitting device includes forming light emitting devices on a support portion, each of the light emitting devices including first to third light emitting cells respectively emitting light of different colors; supplying test power to at least a portion of the light emitting devices using a multi-probe; acquiring an image from the light emitted from the portion of the light emitting devices to which the test power is supplied using an image sensor; identifying normal light emitting devices of the portion of the light emitting devices by determining whether a defect is present in each of the light emitting devices of the portion of the light emitting devices by comparing the image acquired by the image sensor with a reference image; and based on the identifying step, measuring optical characteristics of each of the light emitting devices identified as normal of the portion of the light emitting devices.

19 Claims, 10 Drawing Sheets

(51) Int. Cl.
  *H01L 33/50* (2010.01)
  *H04N 5/225* (2006.01)
  *H01L 33/26* (2010.01)
  *H01L 33/56* (2010.01)
  *H01L 27/15* (2006.01)
  *H01L 33/40* (2010.01)
  *H01L 25/075* (2006.01)

(52) U.S. Cl.
  CPC ............ *H01L 33/26* (2013.01); *H01L 33/507* (2013.01); *H01L 33/56* (2013.01); *H04N 5/2256* (2013.01); *H01L 25/0753* (2013.01); *H01L 33/40* (2013.01); *H01L 33/504* (2013.01); *H01L 2933/005* (2013.01)

(58) Field of Classification Search
  CPC ....... H01L 27/15; H01L 27/156; H01L 25/07; H01L 25/075; H01L 25/0753; H04N 5/22; H04N 5/225; H04N 5/2256
  USPC .......................................................... 438/29
  See application file for complete search history.

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 6/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,277,902 B2 | 3/2016 | Mullick et al. |
| 2012/0249776 A1* | 10/2012 | Ji ........................ G01R 31/2635 348/125 |

FOREIGN PATENT DOCUMENTS

| | | |
|---|---|---|
| JP | 2006-030135 A | 2/2006 |
| JP | 2014-134497 A | 7/2014 |
| JP | 2015-226008 A | 12/2015 |
| JP | 2016-085151 A | 5/2016 |
| KR | 10-2012-0037352 A | 4/2012 |

\* cited by examiner

| 95 | 98 | 80 | 99 | 85 | 80 |
|----|----|----|----|----|----|
| 90 | 92 | 94 | 90 | 95 | 76 |
| 85 | 80 | 85 | 84 | 90 | 96 |
| 93 | 90 | 80 | 78 | 95 | 99 |
| 100 | 92 | 80 | 82 | 94 | 92 |
| 92 | 90 | 77 | 76 | 84 | 85 |

FIG. 5

METHOD OF MANUFACTURING LIGHT EMITTING DEVICE

CROSS-REFERENCE TO RELATED APPLICATION(S)

This application claims the benefit of priority under 35 U.S.C § 119 to Korean Patent Application No. 10-2017-0167590 filed on Dec. 7, 2017 in the Korean Intellectual Property Office, the disclosure of which is incorporated herein by reference in its entirety.

BACKGROUND

1. Field

Example embodiments according to the present inventive concept relate to a method of manufacturing a light emitting device.

2. Description of Related Art

A semiconductor light emitting device emits light using the principle of the recombination of electrons and holes when an electric current is applied thereto, and is widely used as a light source due to possessing various advantages such as low power consumption, high brightness, and the ability to be miniaturized. In detail, after the development of a nitride-based light-emitting device, the utilization range thereof has further expanded to implementation in a backlight unit, a household lighting device, an automobile lighting device, and the like. As described above, as the application range of the semiconductor light emitting device has widened, research into an inspection method in a step of manufacturing a light emitting device for implementing a product having improved reliability has continued in the related art.

SUMMARY

An aspect of the present inventive concept is to provide a method of manufacturing a light emitting device including an inspection method having improved efficiency.

According to an aspect of the present inventive concept, a method of manufacturing a light emitting device includes: forming light emitting devices on a support portion, each of the light emitting devices including first to third light emitting cells respectively emitting light of different colors; supplying test power to at least a portion of the light emitting devices using a multi-probe; acquiring an image from the light emitted from the portion of the light emitting devices to which the test power is supplied using an image sensor; identifying normal light emitting devices of the portion of the light emitting devices by determining whether a defect is present in each of the light emitting devices of the portion of the light emitting devices by comparing the image acquired by the image sensor with a reference image; and based on the identifying step, measuring optical characteristics of each of the light emitting devices identified as normal of the portion of the light emitting devices.

According to an aspect of the present inventive concept, a method of manufacturing a light emitting device includes: forming light emitting devices on a support portion, each of the light emitting devices including first to third light emitting cells respectively emitting light of different colors; supplying test power to at least a portion of the light emitting devices; acquiring an image from the light emitted from the light emitting devices to which the test power is supplied using an image sensor; and identifying normal light emitting devices of the portion of the light emitting devices by determining whether a defect is present in each of the light emitting devices of the portion of the light emitting devices by comparing the image acquired by the image sensor with a reference image, wherein the test power is independently supplied to the first to third light emitting cells.

According to an aspect of the present inventive concept, a method of manufacturing a light emitting device includes: forming light emitting devices on a support portion; supplying test power to at least a portion of the light emitting devices using a multi-probe; acquiring an image from the light emitted from the portion of the light emitting devices to which the test power is supplied using an image sensor; and identifying normal light emitting devices of the portion of the light emitting devices by determining whether a defect is present in each of the light emitting devices of the portion of the light emitting devices by comparing the image acquired by the image sensor with a reference image; and based on the identifying step, measuring optical characteristics in terms of absolute physical quantities of each of the light emitting devices identified as normal of the portion of the light emitting devices.

According to an aspect of the present inventive concept, an apparatus for inspecting a light emitting device includes: a power applying unit provided on one side of light emitting devices, and including a multi-probe configured to supply test power to the light emitting devices; an image measuring unit provided on the other side of the light emitting devices, and configured to acquire an image from the light emitted from the light emitting devices using a single image sensor, and an analyzing unit configured to determine whether a defect is present in each of the light emitting devices by comparing the image having been acquired with a reference image, wherein the multi-probe is connected to each of first to third light emitting cells of the light emitting devices and independently supplies the test power thereto.

BRIEF DESCRIPTION OF DRAWINGS

The above and other aspects, features and other advantages of the present disclosure will be more clearly understood from the following detailed description, taken in conjunction with the accompanying drawings, in which:

FIG. 5 is a view illustrating a method of determining whether a defect is present in a light emitting device according to example embodiments;

DETAILED DESCRIPTION

Hereinafter, example embodiments of the present disclosure will be described with reference to the accompanying drawings.

Figure 1A:
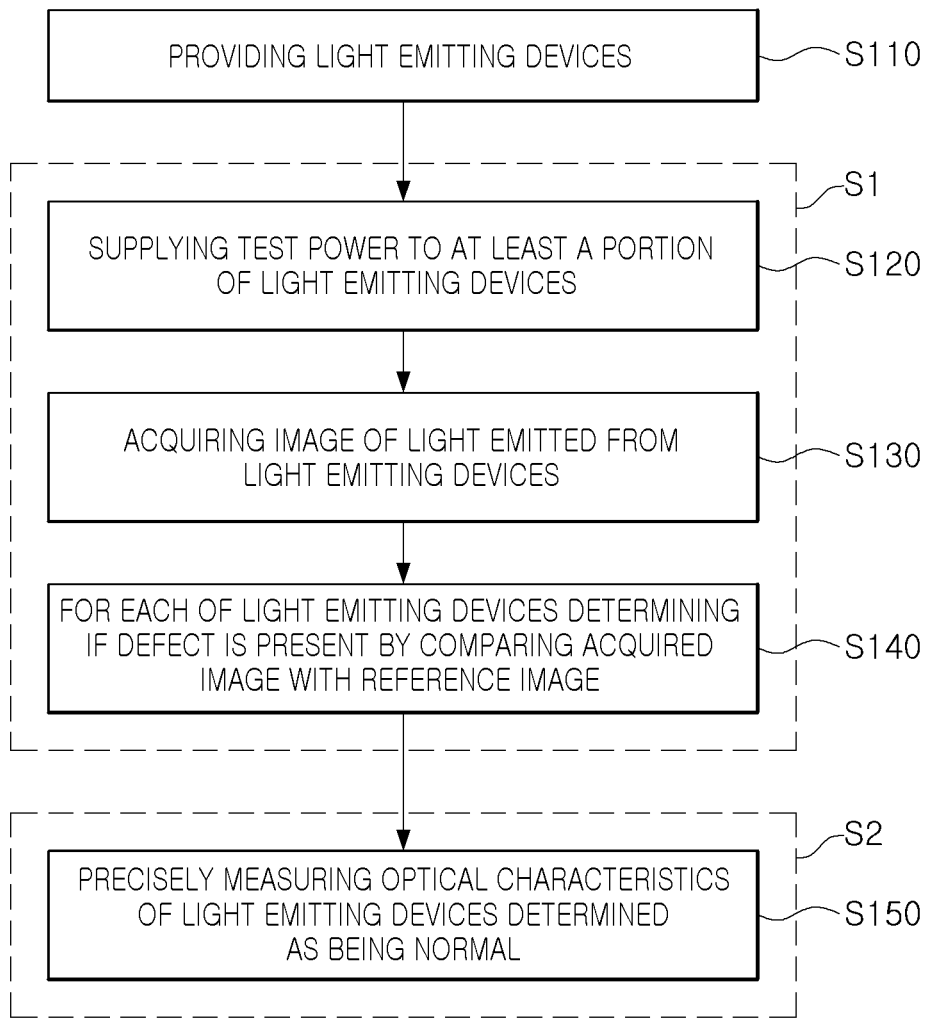
FIGS. 1A and 1B are flow diagrams illustrating a method of inspecting a light emitting device according to example embodiments.
Figure 1B:
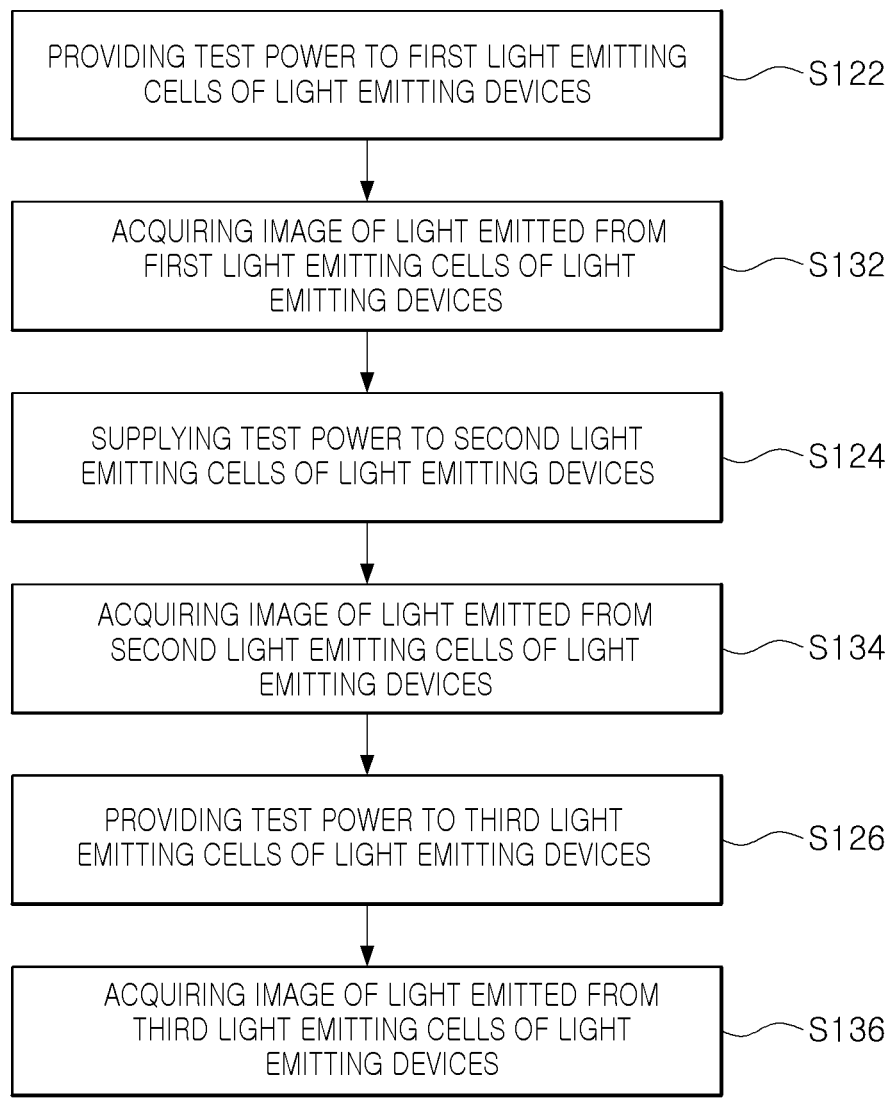

FIGS. 1A and 1B are flow diagrams illustrating a method of inspecting a light emitting device according to example embodiments.

Figure 2:
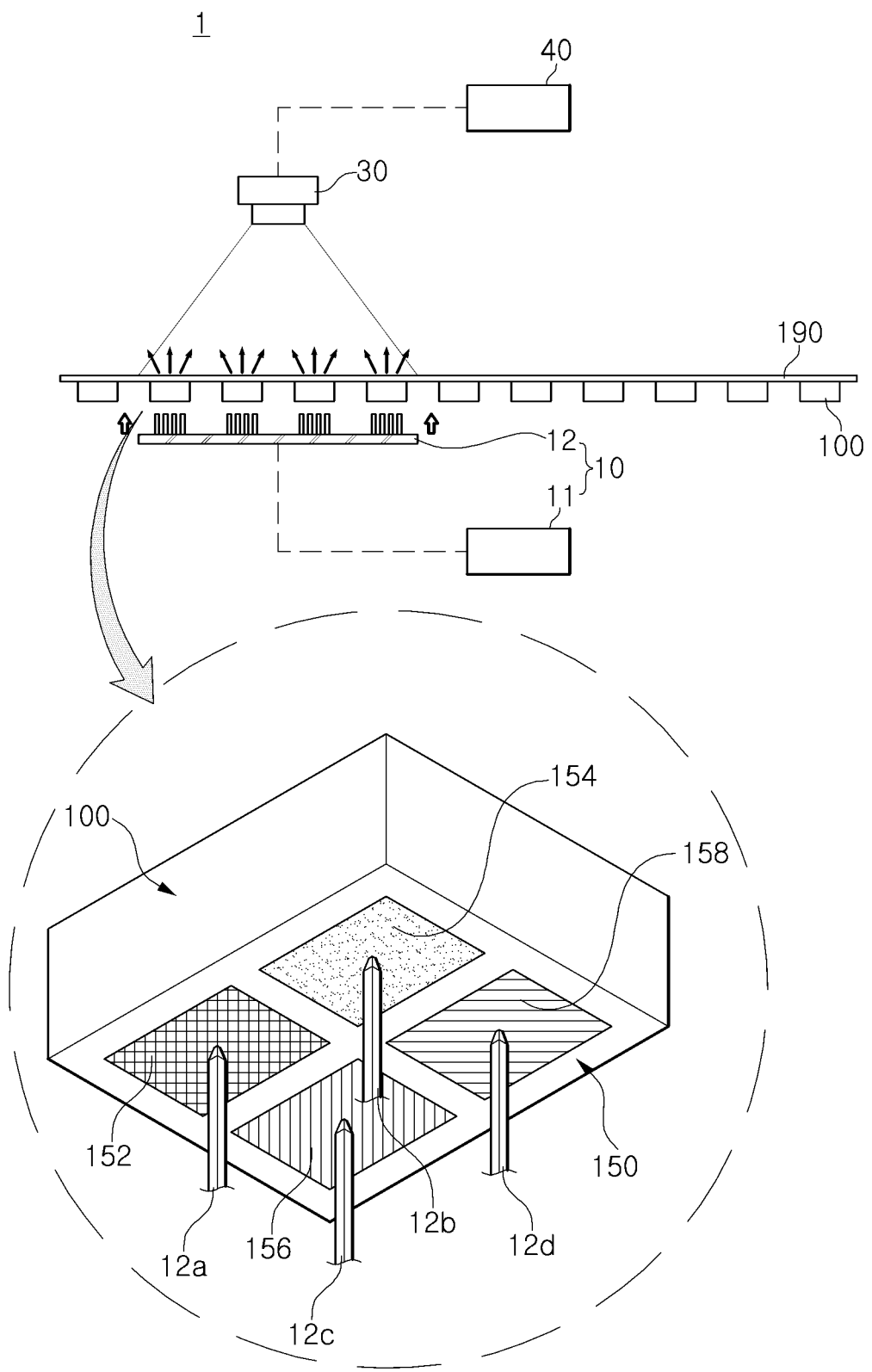
FIGS. 2 and 3 are schematic views of an apparatus for inspecting a light emitting device according to example embodiments.
Figure 3:
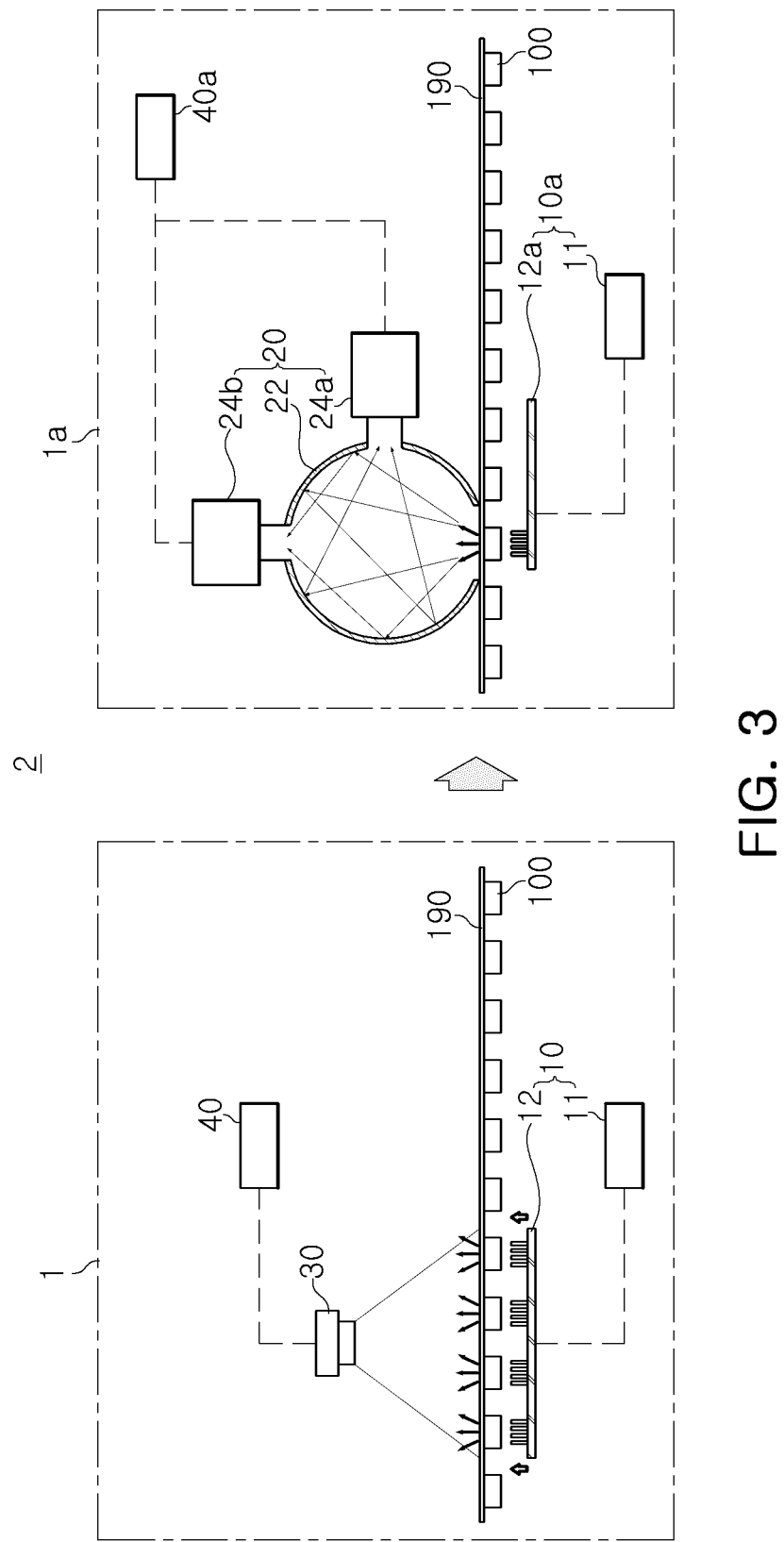

FIGS. 2 and 3 are schematic views of an apparatus for inspecting a light emitting device according to example embodiments.

Referring to FIG. 1A, a method of inspecting a light emitting device may include providing light emitting devices 100 (S110), primarily inspecting the light emitting devices (S1), and secondarily inspecting the light emitting devices (S2).

The primarily inspecting the light emitting devices 100 (S1) may include supplying test power to at least a portion of the light emitting devices 100 (S120), acquiring an image from the light emitted from the light emitting devices 100 (S130), and for each of the light emitting devices 100, determining whether a defect is present by comparing the image having been acquired with a reference image (S140). The secondarily inspecting the light emitting devices (S2) may include precisely measuring optical characteristics of light emitting devices determined as being normal by the primary inspection (S150).

Referring to FIG. 2, an apparatus 1 for inspecting a light emitting device may include a power applying unit 10 for applying test power to light emitting devices 100, an image measuring unit 30 for acquiring an image from the light emitted from the light emitting devices 100, and an analyzing unit 40 for determining whether a defect is present in the light emitting devices 100.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

The power applying unit 10 may apply test power to the light emitting devices 100, to be inspected, and thus may drive the light emitting devices 100 so as to emit light. The power applying unit 10 may include a power supply unit 11 and a multi-probe 12 having a plurality of probes, as illustrated in FIG. 2. The multi-probe 12 may be simultaneously connected to the plurality of light emitting devices 100, and thus may transmit test power to the light emitting devices. The power supply unit 11 according to some exemplary embodiments can include circuit components on a printed circuit board. For example, the power supply unit 11 may include circuit components configured to generate or convert power and supply the power to the light emitting devices 100. Alternatively, the power supply unit 11 may be electrical wiring in a building, for example, connected to a power line, generator, transformer, battery, or other power source, or may refer to the generator, battery, transformer, a voltage source, etc.

The image measuring unit 30 may image light emitted from the light emitting devices 100, and thus may generate and store an image. The image measuring unit 30 may include an image sensor, and the image sensor may be, for example, a charge-coupled device (CCD) camera.

The analyzing unit 40 may compare the image imaged from the image measuring unit 30 to a prestored reference image, and thus may determine whether a defect is present in each of the light emitting devices 100. The analyzing unit 40 may be, for example, a computing system including a workstation.

Hereinafter, with reference to FIG. 1A together with the apparatus for inspecting a light emitting device of FIG. 2, the method of inspecting a light emitting device, described previously, will be described in greater detail.

In providing the light emitting devices 100 (S110), the light emitting devices 100 may be provided as a plurality of light emitting devices on the wafer level. The light emitting devices 100 may be provided while being attached to a support tape 190, a type of support portion, and the light emitting devices 100 may be in a state before passing through a step such as final packaging or the like after being manufactured, or may be in a state in which some processes such as a process of forming an encapsulation portion are not performed. For example, the light emitting devices 100 may be formed on the support tape 190 portion, and the light emitting devices 100 may be in a state before passing through a step such as final packaging or the like after being manufactured, or may be in a state in which some processes such as a process of forming an encapsulation portion are not performed. The light emitting devices 100 may be any device emitting light when power is applied. For example, the light emitting devices 100 may be understood as conceptually including a semiconductor light emitting device, a light emitting device package including the semiconductor light emitting device, a light emitting module, and the like. The support tape 190 may be provided in the form of a substrate or a tape, according to a step of manufacturing the light emitting devices 100, and may be formed of a light-transmitting material. The support tape 190 may also be referred to as support portion 190.

The supplying test power to at least a portion of the light emitting devices 100 (S120) may be applying an electrical signal from the power applying unit 10 so as to emit light by recombination of electrons and holes in active layers of the light emitting devices 100. When the light emitting devices 100 are provided on the wafer level, the test power may be simultaneously supplied to a portion of the light emitting devices 100 using the multi-probe 12 on one side of the support portion 190. For example, the light emitting devices 100 may be grouped in a predetermined number, and the test power is sequentially supplied to each group, so the inspection may be performed on the entirety of the light emitting devices 100. In this exemplary embodiment, the support portion 190 or the apparatus 1 for inspecting a light emitting device moves, so the inspection may be repeatedly performed on the light emitting devices 100 of each group.

The acquiring an image from the light emitted from the light emitting devices 100 (S130) may be imaging light emitted from the light emitting devices 100 to which the test power is supplied as a single image by the image measuring unit 30. In this step, a single image sensor is used and a single image is captured, so an image from the light emitted from a plurality of light emitting devices 100 may be acquired. Thus, as compared to a case in which an image is imaged with respect to each light emitting device 100, inspection may be efficiently performed.

The image measuring unit 30 may be disposed on the other side opposite to a direction in which the multi-probe 12 is located based on the support portion 190. Light emitted from the light emitting devices 100 may be transmitted through the support portion 190 and sensed, but is not limited thereto. According to a providing method of the light emitting devices 100, a structure thereof, and the like, light emitted from the light emitting devices 100 may directly reach the image measuring unit 30, and positions of the multi-probe 12 and the image measuring unit 30 may be variously changed in example embodiments.

Referring to FIG. 1B, in an example embodiment, the supplying test power (S120) and the acquiring an image (S130) may be further specified according to a structure of the light emitting devices 100. As illustrated in an enlarged view of FIG. 2, each of the light emitting devices 100 includes three light emitting cells, that is, first to third light emitting cells, emitting light of different wavelengths, and thus includes four electrode pads 150. According to exemplary embodiments, each of the light emitting devices 100 is a pixel of a display (e.g., a display panel) and the light emitting cells included in each of the light emitting devices 100 are sub-pixels each having a light emitting diode that may be separately controlled. A first electrode pad 152 is connected to the first light emitting cell, a second electrode pad 154 is connected to the second light emitting cell, a third electrode pad 156 is connected to the third light emitting cell, and a common electrode pad 158 is commonly connected to the first to third light emitting cells. According to this exemplary embodiment, the multi-probe 12 of the power applying unit 10 may include a first probe 12a, a second probe 12b, a third probe 12c, and a fourth probe 12d, connected to the four electrode pads 150 of a single light emitting device 100, respectively. For example, according to this exemplary embodiment, the multi-probe 12 of the power applying unit 10 may include a first probe 12a connected to the first light emitting cell of the light emitting device 100, a second probe 12b connected to the second light emitting cell of the light emitting device 100, a third probe 12c connected to the third light emitting cell of the light emitting device 100, and a fourth probe 12d connected to the fourth light emitting cell of the light emitting device 100.

In an example embodiment, the supplying of the test power (S120) and the acquiring of an image (S130) may include sequentially supplying power to the first to third light emitting cells (S122, S124, S126) as well as acquiring an image with respect to each of the first to third light emitting cells (S132, S134, S136). For example, the supplying test power (S120) and the acquiring an image (S130) may include supplying test power to first light emitting cells of the light emitting devices 100 (S122), acquiring an image from the light emitted from the first light emitting cells of the light emitting devices 100 (S132), supplying test power to second light emitting cells of the light emitting devices 100 (S124), acquiring an image from the light emitted from the second light emitting cells of the light emitting devices 100 (S134), supplying test power to third light emitting cells of the light emitting devices 100 (S126), and acquiring an image from the light emitted from the third light emitting cells of the light emitting devices 100 (S136). To drive one among the first to third light emitting cells, an electrical signal may be applied to one, among the first electrode pad 152, the second electrode pad 154, and the third electrode pad 156, corresponding thereto, as well as the common electrode pad 158.

However, in an example embodiment, while the first to third light emitting cells are not sequentially driven, the first to third light emitting cells may be simultaneously driven. In this exemplary embodiment, an electrical signal may be applied to the first electrode pad 152, the second electrode pad 154, and the third electrode pad 156, as well as the common electrode pad 158.

The various pads (152, 154, 156, 158) of a device described herein may be conductive terminals connected to internal wiring of the device, and may transmit signals and/or supply voltages between an internal wiring and/or internal circuit of the device and an external source. For example, chip pads of a semiconductor chip may electrically connect to and transmit supply voltages and/or signals between an integrated circuit of the semiconductor chip and a device to which the semiconductor chip is connected. The various pads may be provided on or near an external surface of the device and may generally have a planar surface area (often larger than a corresponding surface area of the internal wiring to which they are connected) to promote connection to a further terminal, such as a bump or solder ball, and/or an external wiring.

The determining whether a defect is present in each of the light emitting devices 100 by comparing the image having been acquired with a reference image (S140) may include quantifying a relative ratio such as color, brightness, chroma, and the like by comparing the image having been acquired with a reference image, and determining whether the ratio having been quantified is equal to or greater than a threshold ratio. For example, in the step described above, not absolute optical characteristics of the light emitting devices 100 but relative optical characteristics thereof are roughly inspected, so light emitting devices 100, which do not reach a certain criterion, may be distinguished. For example, the reference image may be an image when the light emitting device 100 has a maximum light emitting performance. The determination of whether a defect is present will be described in greater detail below with reference to FIGS. 4A to 5.

The precisely measuring optical characteristics of the light emitting devices 100 determined as being normal (S150) may be performed on the light emitting devices 100, passing through a primary inspection step (S1) through the steps (S120-140) described above. In the step described above, optical characteristics are precisely measured with respect to each of the light emitting devices 100, and are then quantified. For example, the optical characteristics may be measured with absolute physical quantities such as luminance. Hereinafter, the step described above will be greater detail with reference to FIG. 3.

Referring to FIG. 3, an apparatus 2 for inspecting a light emitting device may include a first inspecting device 1 and a second inspecting device 1a. The first inspecting device 1 may be the same as the apparatus 1 for inspecting a light emitting device described above with reference to FIG. 2. The second inspecting device 1a may include a power applying unit 10a, an optical characteristics measuring unit 20, and an analyzing unit 40a determining whether a defect is present in light emitting devices 100.

The power applying unit 10a may selectively apply test power to each of light emitting devices 100, passing the primary inspection. The power applying unit 10a may include a power supply unit 11 and a probe 12a. The probe 12a may be connected to a single light emitting device 100 and may transmit the test power supplied by the power supply unit 11.

The optical characteristics measuring unit 20 may include a light collector 22 collecting light emitted from the light emitting devices 100 and sensing units 24a and 24b sensing the light having been collected. The light collector 22 may have an internal surface including a reflective surface, and thus may guide light emitted from the light emitting devices 100 to the sensing units 24a and 24b. The light collector 22 may have an integrating sphere spreading light, having been emitted, to the entirety of an inner spherical surface as illustrated in FIG. 3, but is not limited thereto. For example, the light collector 22 may include a light guide including a cladding layer or various types of collectors. The sensing units 24a and 24b may include, for example, at least one of a photodiode for measuring luminance and a spectrometer for measuring color coordinates. By means of the sensing units 24a and 24b, a value of absolute physical quantities, to be quantified, such as luminance or a color coordinate value, may be obtained.

The analyzing unit 40a may determine whether a defect is present in each of the light emitting devices 100 from optical characteristics obtained from the optical characteristics measuring unit 20. Whether a defect is present may be determined by determining whether optical characteristics of the light emitting device 100, having been measured, are within a specific range. For example, the analyzing unit 40a of the second inspecting device 1a may perform determination of whether a defect is present not by relative comparison but by absolute physical quantities of optical characteristics, in a manner different from the first inspecting device 1. The analyzing unit 40a may be, for example, a computing system including a workstation.

In an example embodiment, in the primarily inspecting the light emitting devices (S1), a plurality of light emitting devices are inspected in a relatively short amount of time by imaging an image, so an inspection may be performed with high efficiency. As the secondary inspection is only performed on the light emitting devices passing through the primary inspection described above, inspection efficiency in a process of manufacturing light emitting devices may be improved, so the unnecessary inspection time may be reduced.

Figure 4A:
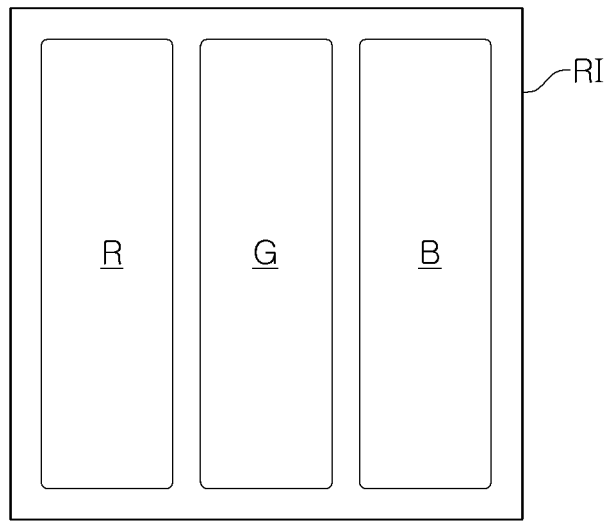
FIGS. 4A and 4B are views illustrating a reference image used for determination of whether a defect is present in a light emitting device according to example embodiments.
Figure 4B:
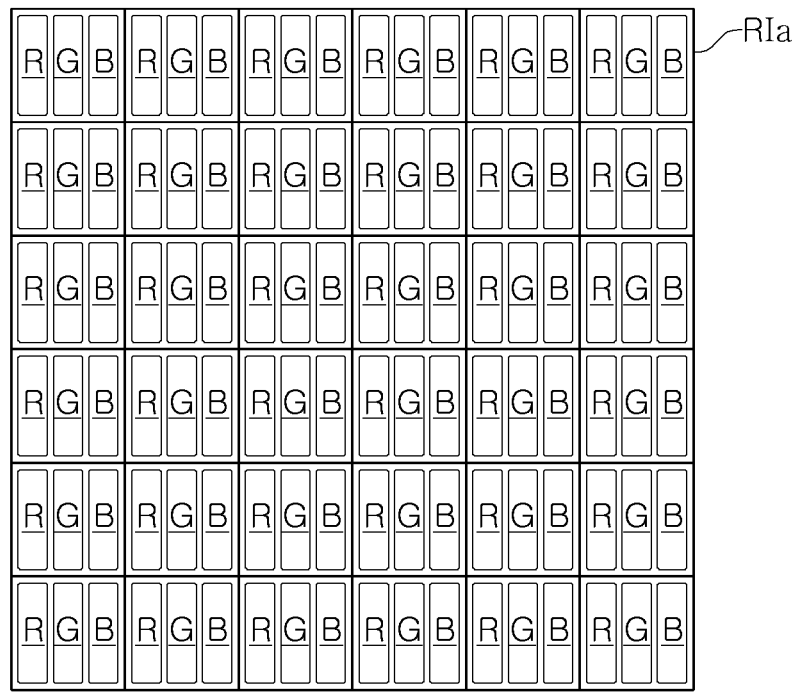

FIGS. 4A and 4B are views for illustrating a reference image used for determination of whether a defect is present in a light emitting device according to example embodiments.

FIG. 5 is a view illustrating a method of determining whether a defect is present in a light emitting device according to example embodiments.

Referring to FIGS. 4A and 4B, reference images used in the determining whether a defect is present in each of light emitting devices by comparing the image having been acquired with a reference image (S140) are schematically illustrated. The reference images may be provided as criteria for relatively determining whether light emitting elements are defective or not.

As illustrated in FIG. 4A, a reference image RI may be a light-emitting image of a single light emitting device having three light emitting cells R, G, and B emitting light of different wavelengths. Alternatively, as illustrated in FIG. 4B, a reference image RIa may be a light-emitting image of a plurality of light emitting devices, each light emitting device having three light emitting cells R, G, and B emitting light of different wavelengths. In this exemplary embodiment, the number and arrangement of light emitting devices forming the reference image RIa may be the same as the number and arrangement of light emitting devices to which test power is supplied in the step of supplying test power (S120) of FIG. 1A, and in which an image of emitted light in the step of acquiring an image (S130) is acquired.

Referring to FIG. 5, reference images RI and RIa are compared to an image having been acquired, and thus a value of relative characteristics of respective light emitting devices may be quantified. When the reference image RI is a light-emitting image with respect to a single light emitting device as illustrated in FIG. 4A, quantification may be performed by comparing each light emitting device region of an image having been acquired with the reference image RI. When the reference image RIa is a light-emitting image of a plurality of light emitting devices as illustrated in FIG. 4B, a value of characteristics with respect to each light emitting device may be quantified by comparing an image having been acquired with the reference image RIa at 1:1. In example embodiments, when light emitting cells R, G, and B are independently driven and inspection is performed, quantification may be performed by comparing a region of corresponding light emitting cells R, G, and B with an image having been acquired in the reference images RI and RIa.

The characteristics may be analyzed by an image, and may be, for example, color, brightness, or chroma, but are not limited thereto. The value of characteristics having been quantified may be relatively quantified by comparing optical characteristics analyzed by an image with the reference image RI. The value thereof itself may not have absolute physical quantities, or the value thereof may be obtained by relative comparison even when the value has absolute physical quantities.

When a value of the characteristics of the reference images RI and RIa is regarded as 100, a value of characteristics, having been relatively quantified, of respective light emitting devices may be analyzed by way of example as illustrated in FIG. 5. When it is set to determine as defective in a case in which the value of the characteristics is less than 80, light emitting devices, disposed in positions corresponding to row 2 and column 6; row 4 and column 4; row 6 column 3; and row 6 column 4 of FIG. 5 may be determined as defective.

Figure 6:
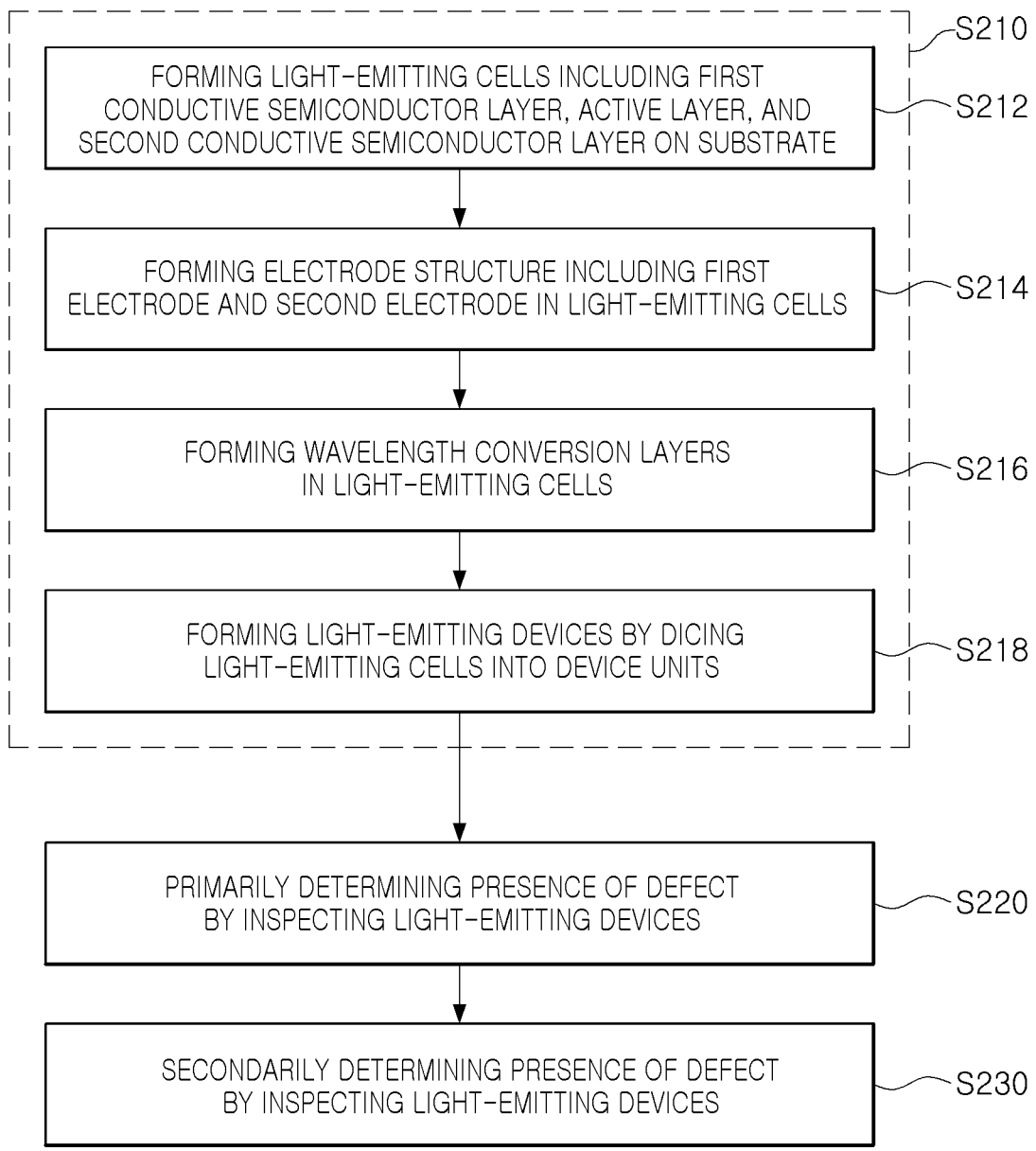
FIG. 6 is a flow diagram illustrating a method of manufacturing a light emitting device according to example embodiments.

FIG. 6 is a flow diagram illustrating a method of manufacturing a light emitting device according to example embodiments.

FIGS. 7 through 12 are schematic views for each main step illustrating a method of manufacturing a light emitting device according to example embodiments.

Referring to FIG. 6, a method of manufacturing a light emitting device may include forming light emitting devices (S210), primarily determining whether a defect is present by inspecting the light emitting devices (S220), and secondarily determining whether a defect is present by inspecting the light emitting devices (S230).

Figure 7:
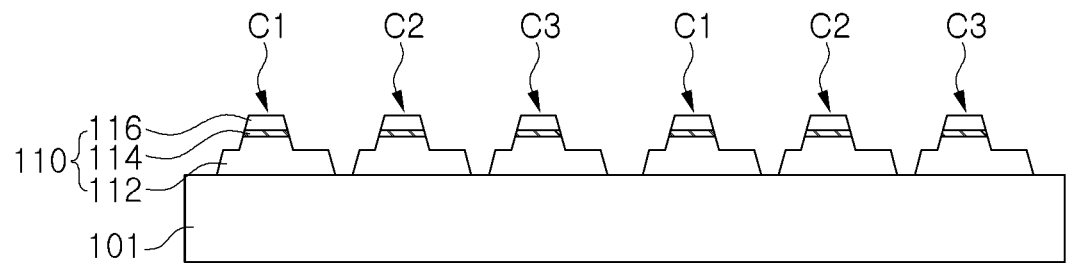
FIGS. 7 through 12 are schematic views for each main operation illustrating a method of manufacturing a light emitting device according to example embodiments.

Referring to FIGS. 6 and 7, first to third light emitting cells C1, C2, and C3 may be formed on a substrate 101 (S212), and each of the first to third light emitting cells C1, C2, and C3 includes a first conductive semiconductor layer 112, an active layer 114, and a second conductive semiconductor layer 116. According to example embodiments, the bottommost surface of the first conductive semiconductor layer 112 may be larger than the bottommost surface of the active layer 114 in a direction parallel to an upper surface of the substrate 101, and the bottommost surface of the active layer 114 may be larger than the bottommost surface of the second conductive semiconductor layer 116 in the direction parallel to the upper surface of the substrate.

The first conductive semiconductor layer 112, the active layer 114, and the second conductive semiconductor layer 116 are sequentially stacked on the substrate 101, and thus a light emitting structure 110 may be formed.

The substrate 101 may be provided as a substrate for semiconductor growth. The substrate 101 may be formed of an insulating, conductive, or semiconductive material, and may be formed of, for example, sapphire, silicon (Si), SiC, $MgAl_2O_4$, MgO, $LiAlO_2$, $LiGaO_2$, GaN, or the like.

The first conductive semiconductor layer 112 and the second conductive semiconductor layer 116 may be formed of semiconductors doped with n-type and p-type impurities, respectively, but are not limited thereto. Alternatively, the first conductive semiconductor layer 112 and the second conductive semiconductor layer 116 may be formed of p-type and n-type semiconductors, respectively. The first conductive semiconductor layer 112 and the second conductive semiconductor layer 116 may be formed of a material with a composition of a nitride semiconductor, for example, a material having a composition of $Al_xIn_yGa_{1-x-y}N$ ($0 \leq x \leq 1$, $0 \leq y \leq 1$, $0 \leq x+y \leq 1$), and each layer may be formed of a single layer or may include a plurality of layers having different characteristics such as a doping concentration, a composition, and the like. However, the first conductive semiconductor layer 112 and the second conductive semiconductor layer 116 may be formed of an AlInGaP or AlInGaAs-based semiconductor in addition to a nitride semiconductor.

The active layer 114 is disposed between the first conductive semiconductor layer 112 and the second conductive semiconductor layer 116, and emits light having a predetermined energy by recombining electrons and holes. The active layer 114 may be a layer formed of a single material such as indium gallium nitride (InGaN), or the like, and may have a single quantum well (SQW) or multiple quantum well (MQW) structure in which a quantum barrier layer and a quantum well layer are alternately arranged. For example, in the case of a nitride semiconductor, the active layer may have a GaN/InGaN structure. The first conductive semiconductor layer 112 and the second conductive semiconductor layer 116 as well as the active layer 114 may be formed using, for example, a metal organic chemical vapor deposition (MOCVD) or hydride vapor phase epitaxy (HVPE) process.

When the active layer 114 includes InGaN, by increasing the content of indium (In), a crystal defect caused by lattice mismatch may be reduced, so the internal quantum efficiency of the semiconductor light emitting device 100 may be increased. Moreover, according to the content of indium (In) in the active layer 114, a light-emitting wavelength may be adjusted. The light emitting structure 110 may be formed to allow the active layer 114 to emit light having different wavelengths, in regions forming the first to third light emitting cells C1, C2, and C3. The first to third light emitting cells C1, C2, and C3 may be formed to emit red, green, and blue light, and the first to third light emitting cells C1, C2, and C3 may form a single light emitting device. Regions forming the first to third light emitting cells C1, C2, and C3 may be formed while the content of indium (In) of the active layer 114 is varied, but are not limited thereto.

In example embodiments, a buffer layer (not shown) may be further formed between the substrate 101 and the first conductive semiconductor layer 112. The buffer layer may be formed of, for example, aluminum gallium nitride ($Al_xGa_{1-x}N$) grown at low temperature without doping.

Next, portions of the second conductive semiconductor layer 116 and the active layer 114 are etched, and thus a mesa structure is formed to expose a portion of the first conductive semiconductor layer 112. Moreover, an isolation process for separating the light emitting structure 110 to the first to third light emitting cells C1, C2, and C3 may be performed. Thus, the first to third light emitting cells C1, C2, and C3 may be arranged on the substrate 101 in a plurality of rows and a plurality of columns.

Figure 8:
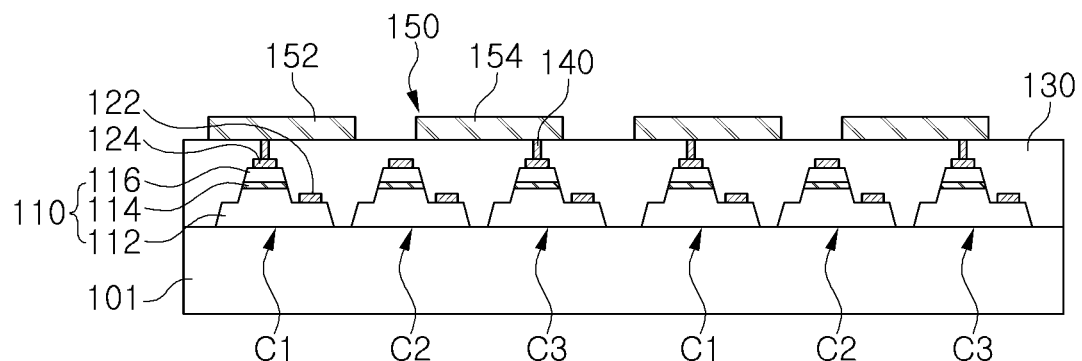

Referring to FIGS. 6 and 8, electrode structures may be formed in the first to third light emitting cells C1, C2, and C3 (S214), and each of the electrode structures includes a first electrode 122 and a second electrode 124. The electrode structures may further include contact electrodes 140 and electrode pads 150. In the step described above, an encapsulation portion 130, covering the first electrode 122 and the second electrode 124 as well as the contact electrodes 140, may be further provided.

The first electrode 122 and the second electrode 124 may be disposed on and electrically connected to the first conductive semiconductor layer 112 and the second conductive semiconductor layer 116, respectively. The first electrode 122 and the second electrode 124 may have a single layer or multilayer structure of a conductive material. For example, the first electrode 122 and the second electrode 124 may include a material such as gold (Au), silver (Ag), copper (Cu), zinc (Zn), aluminum (Al), indium (In), titanium (Ti), silicon (Si), germanium (Ge), tin (Sn), magnesium (Mg), tantalum (Ta), chromium (Cr), tungsten (W), ruthenium (Ru), rhodium (Rh), iridium (Ir), nickel (Ni), palladium (Pd), platinum (Pt), or the like or one or more of alloys thereof. In example embodiments, at least one of the first electrode 122 and the second electrode 124 may be a transparent electrode, for example, indium tin oxide (ITO), aluminum zinc oxide (AZO), indium zinc oxide (IZO), or zinc oxide (ZnO).

The contact electrodes 140 are disposed to be connected to the electrode pads 150, and are formed to allow each of the second electrodes 124 of the first to third light emitting cells C1, C2, and C3 to be connected to a single electrode pad 150, and to allow the first electrodes 122 of the first to third light emitting cells C1, C2, and C3 to be commonly connected to the single electrode pad 150. Thus, in a region not illustrated, the first electrodes 122 may be connected together. To this end, an additionally conductive layer may be further formed. Moreover, the arrangement and a shape of the electrode structure are illustrated in FIG. 8 by way of example, and may be variously changed according to an example embodiment. The contact electrodes 140 may be formed of a conductive material, for example, copper (Cu), but are not limited thereto.

The encapsulation portion 130 may be formed using a process of applying a polymeric resin material to cover the first to third light emitting cells C1, C2, and C3, the first electrode 122 and the second electrode 124, as well as the contact electrodes 140, and a planarization process, such as grinding, or the like. By the planarization process, the contact electrodes 140 may be exposed through an upper surface of the encapsulation portion 130. The encapsulation portion 130 may be formed of a material having a relatively high Young's Modulus to support the first to third light emitting cells C1, C2, and C3, and may be formed of a material with high thermal conductivity for heat dissipation. The encapsulation portion 130 may be formed of, for example, epoxy resin or silicone resin, and may include light-reflective particles. The light-reflective particles may be, for example, titanium dioxide ($TiO_2$) and/or aluminum oxide ($Al_2O_3$).

The electrode pads 150 may be formed on a surface of the encapsulation portion 130, and may include first to third electrode pads 152, 154, and 156 as well as the common electrode pad 158 although not illustrated in FIG. 8. The first to third electrode pads 152, 154, and 156 may be connected to the second electrodes 124 of the first to third light emitting cells C1, C2, and C3, respectively, while the common electrode pad 158 may be commonly connected to the first electrodes 122 of the first to third light emitting cells C1, C2, and C3. The electrode pads 150 may be formed of a conductive material, for example, copper (Cu), but are not limited thereto.

Figure 9:
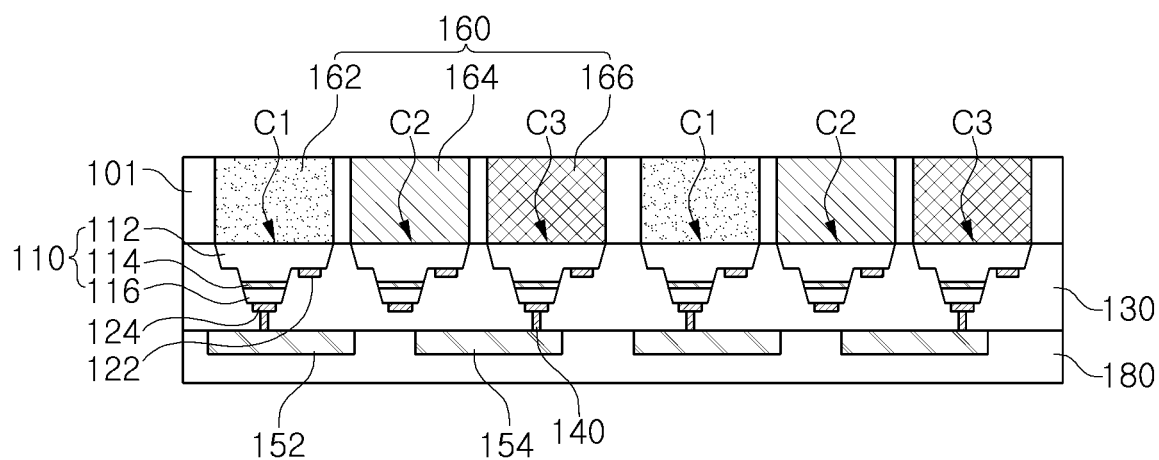

Referring to FIGS. 6 and 9, wavelength conversion layers 160 may be formed in the first to third light emitting cells C1, C2, and C3 (S216).

First, after a support substrate 180 is attached to upper portions of the first to third light emitting cells C1, C2, and C3, a portion of the substrate 101 is removed, so a region in which the wavelength conversion layers 160 are to be formed may be provided.

The support substrate 180 is temporarily attached to support structures of the first to third light emitting cells C1, C2, and C3 formed in a preceding process, during a subsequent process. The support substrate 180 may have a form of a substrate or a tape. According to example embodiments, a process of attaching the support substrate 180 may be omitted.

A portion of the substrate 101 may be removed to expose the first conductive semiconductor layer 112 in the lower portion of the first to third light emitting cells C1, C2, and C3. The substrate 101, which remains, may have a partition structure, forming a boundary between the first to third light emitting cells C1, C2, and C3, as well as a boundary between light emitting devices, adjacent to each other. In example embodiments, the partition structure may be formed to be thicker between the light emitting devices, as compared to between the first to third light emitting cells C1, C2, and C3, but is not limited thereto. According to example embodiments, the partition structure may be formed of a material different from that of the substrate 101. For example, a material composition of the partition structure may be different than a material composition of the substrate 101. In this exemplary embodiment, after the substrate 101 is removed, the partition structure described above may be formed using a material such as resin, or the like.

Next, in a region from which the substrate 101 is removed, the wavelength conversion layers 160 may be formed. The wavelength conversion layers 160 may include first to third wavelength conversion layers 162, 164, and 166. The first to third wavelength conversion layers 162, 164, and 166 may include a phosphor and/or a quantum dot to emit light having different colors. According to example embodiments, before the wavelength conversion layers 160 are formed, a concave-convex portion for increasing light emission efficiency may be formed in an upper surface of the first conductive semiconductor layer 112.

Figure 10A:
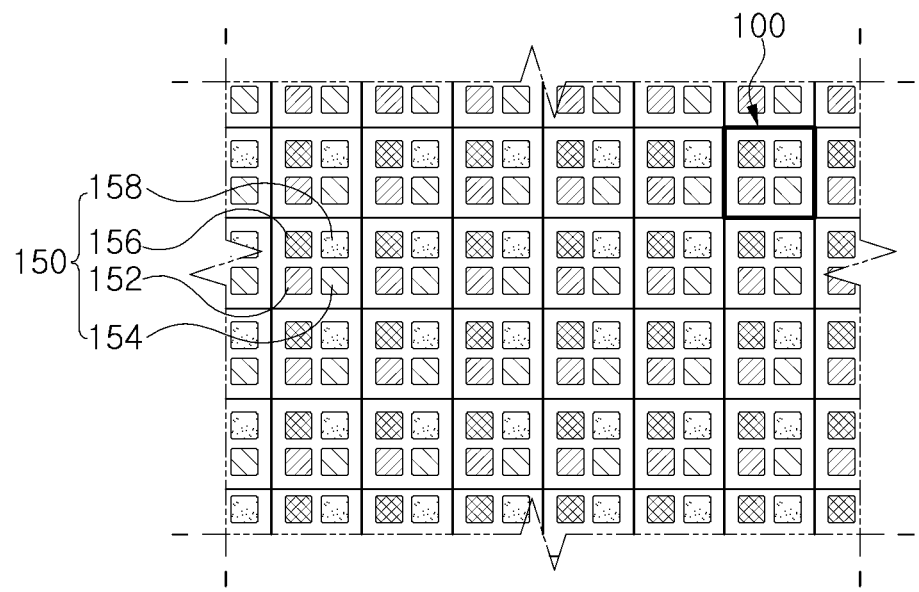
Figure 10B:
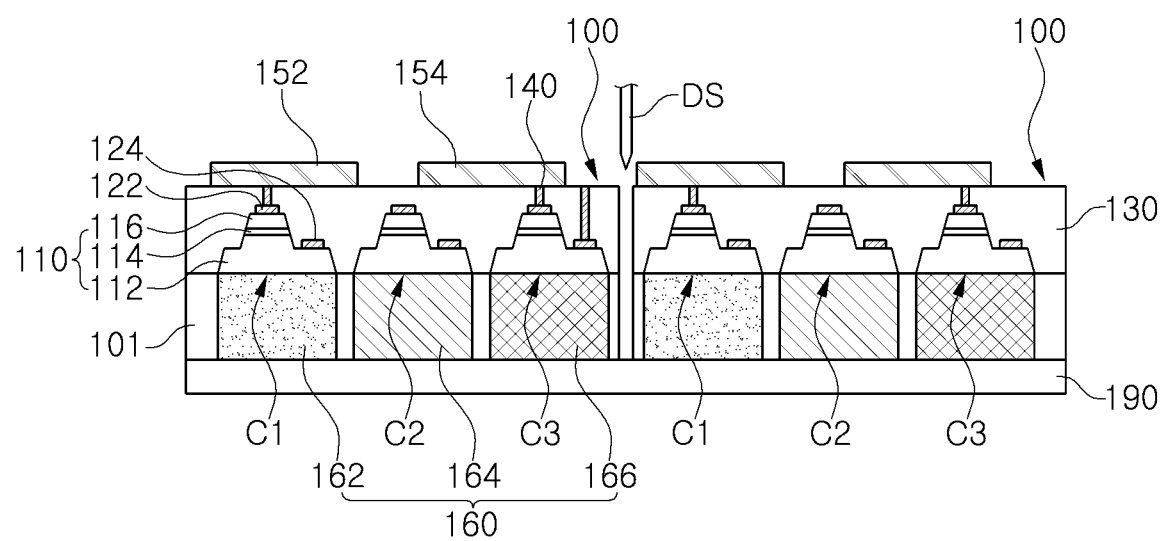

Referring to FIGS. 6, 10A, and 10B, the first to third light emitting cells C1, C2, and C3 are diced into device units, and thus the light emitting devices 100 may be formed (S218).

First, the support tape 190 is attached to the wavelength conversion layers 160, and the support substrate 180 may be removed. The support tape 190 may be, for example, a light-transmitting tape. Next, cutting may be performed in units of the light emitting device 100 including the first to third light emitting cells C1, C2, and C3 using a blade DS. In the cutting process described above, the encapsulation portion 130 and the substrate 101 may be cut at a boundary of the light emitting devices 100, and a portion of the support tape 190 may be cut.

As illustrated in FIG. 10A, each process of forming the light emitting devices 100 (S210) may be performed on the wafer level. However, a specific structure of the light emitting devices 100, arrangement of an electrode structure, and the like may be variously changed according to an example embodiment.

Figure 11:
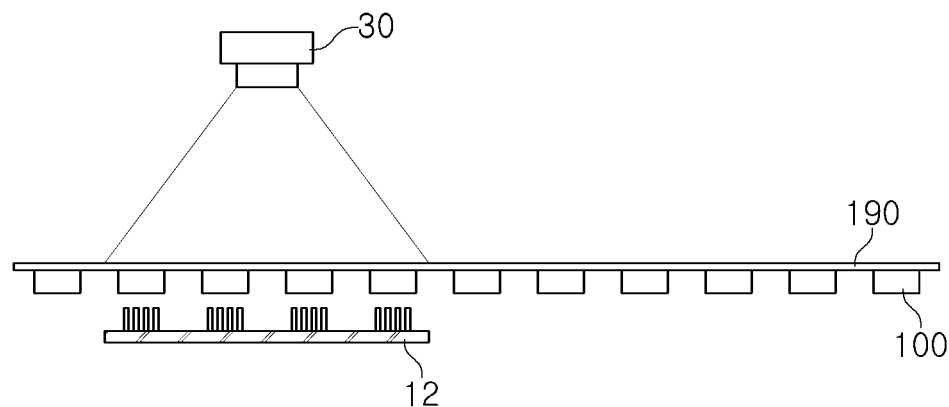

Referring to FIGS. 6 and 11, whether a defect is present may be primarily determined by inspecting the light emitting devices 100 (S220).

The light emitting devices 100 may be tested using an inspection method using the apparatus 1 for inspecting a light emitting device as described above with reference to FIGS. 1A, 2, and 3. The light emitting devices 100 are grouped into a predetermined number, and test power may be simultaneously applied thereto by the multi-probe 12. An image from the light emitted from the light emitting devices 100 to which the test power is applied may be acquired by the image measuring unit 30. Next, the light emitting devices 100 may be determined as being in a normal state or in a defect state using the method of determining whether a defect is present as illustrated above with reference to FIGS. 4A and 5, and may be classified.

In an example embodiment, after a dicing process is performed with respect to the light emitting devices 100, the primary inspection is performed while the support tape 190 is attached. The case described above is illustrated by way of example, but is not limited thereto. In example embodiments, the light emitting devices 100 may be provided in various forms during various process steps.

Figure 12:
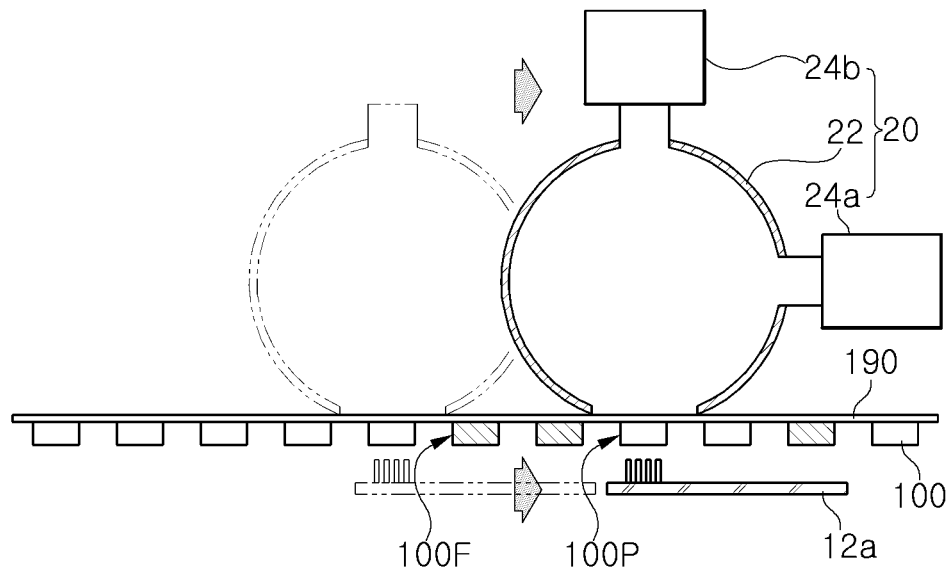

Referring to FIGS. 6 and 12, whether a defect is present may be secondarily determined by inspecting the light emitting devices 100 (S230).

The secondary inspection may be only performed with respect to light emitting devices 100P determined as being normal by the primary inspection, and may not be performed with respect to light emitting devices 100F determined as defective. The secondary inspection may be tested by a method of inspecting using the apparatus 2 for inspecting a light emitting device which includes a second light inspecting device 1a as illustrated with reference to FIGS. 1A and 3. The light collector 22 is located above a single light emitting device 100P and test power is applied by the probe 12a, so the light emitting device 100P may be tested. The secondary inspection may be performed with respect to only the light emitting devices 100P determined as being normal by the primary inspection, while the light collector 22 and the probe 12a are moved, or the support tape 190 is moved. Light emitted from the light emitting device 100P to which the test power is applied is sensed by the sensing units 24a and 24b, so optical characteristics may be analyzed. Thus, each of the light emitting devices 100P may be determined as being in a normal state or a defective state, and may be classified.

Through the primary inspection and the secondary inspection, the light emitting devices 100 finally classified as being in a normal state may be selectively separated from the support tape 190. A subsequent process required for commercialization may be performed on the light emitting devices 100, having been separated. For example, the light emitting devices 100 finally classified as being in a normal state may be selectively separated from the support tape 190 and packaged and/or assembled into a display panel or the optical characteristics of light emitting devices 100 determined to include a defect are excluded from the use of measured optical characteristics. Even when a plurality of light emitting devices 100 are manufactured on the wafer level, approximate optical characteristics may be simply inspected in a short time by the primary inspection, and thus the light emitting devices 100 may be filtered. Thus, the time and costs, required for the secondary inspection, may be significantly reduced.

As set forth above, according to example embodiments of the present inventive concept, a method of manufacturing a light emitting device including an inspection method with improved efficiency by simultaneously testing a plurality of light emitting devices using an image during a manufacturing process.

While example embodiments have been shown and described above, it will be apparent to those skilled in the art that modifications and variations could be made without departing from the scope of the present disclosure, as defined by the appended claims.

What is claimed is:

1. A method of manufacturing a light emitting device, comprising:
   forming light emitting devices on a support portion, each of the light emitting devices including first to third light emitting cells respectively emitting light of different colors;
   supplying test power to at least a portion of the light emitting devices using a multi-probe;
   acquiring an image from the light emitted from the portion of the light emitting devices to which the test power is supplied using an image sensor;
   identifying normal light emitting devices of the portion of the light emitting devices by determining whether a defect is present in each of the light emitting devices of the portion of the light emitting devices by comparing the image acquired by the image sensor with a reference image; and
   based on the identifying step, measuring optical characteristics of each of the light emitting devices identified as normal of the portion of the light emitting devices,
   wherein the step of determining whether the defect is present includes:
   quantifying a relative ratio of at least one of color, brightness, and chroma, by comparing the image having been acquired with the reference image; and
   determining whether the ratio having been quantified is equal to or greater than a threshold ratio.

2. The method of manufacturing a light emitting device of claim 1,
   wherein the step of supplying test power includes sequentially supplying power to each of the first to third light emitting cells, and
   wherein the step of acquiring an image includes acquiring the image with respect to each of the first to third light emitting cells.

3. The method of manufacturing a light emitting device of claim 2,
   wherein the step of determining whether the defect is present is performed for each of the first to third light emitting cells.

4. The method of manufacturing a light emitting device of claim 1,
   wherein each of the light emitting devices includes first to third electrode pads electrically connected to the first to third light emitting cells, respectively, and a common electrode pad commonly connected to the first to third light emitting cells,
   wherein the multi-probe is connected to the first to third electrode pads and the common electrode pad.

5. The method of manufacturing a light emitting device of claim 4,
   wherein the test power is supplied through one, among the first to third electrode pads, and the common electrode pad.

6. The method of manufacturing a light emitting device of claim 1,
   wherein the step of supplying test power includes simultaneously supplying power to the first to third light emitting cells.

7. The method of manufacturing a light emitting device of claim 1,
   wherein the step of acquiring an image includes acquiring the image by capturing a single image using the image sensor, provided as a single image sensor.

8. The method of manufacturing a light emitting device of claim 7,
   wherein the number of the light emitting devices to which the test power is supplied is determined within a range in which a single image is acquired by the image sensor.

9. The method of manufacturing a light emitting device of claim 1,
   wherein the step of measuring optical characteristics includes measuring optical characteristics of the light emitting devices with absolute physical quantities.

10. The method of manufacturing a light emitting device of claim 9,
    wherein the step of measuring optical characteristics includes:
    placing a light collector to cover a light emitting surface of each of the light emitting devices; and
    quantitatively analyzing light collected by the light collector.

11. The method of manufacturing a light emitting device of claim 9,
    wherein the physical quantities are luminance.

12. The method of manufacturing a light emitting device of claim 1,
    wherein the support portion is formed of a light-transmitting material, and
    the image sensor is configured to sense light transmitted through the support portion.

13. The method of manufacturing a light emitting device of claim 1,
    wherein the step of supplying test power to a portion of light emitting devices among the light emitting devices is repeatedly performed, by moving the support portion.

14. The method of manufacturing a light emitting device of claim 1, further comprising:
    preparing the first to third light emitting cells, provided as a plurality of first to third light emitting cells, arranged in rows and columns on the support portion; and
    dicing the light emitting cells into light emitting device units on the support portion.

15. The method of manufacturing a light emitting device of claim 14,
    wherein the step of supplying test power is performed after the dicing.

16. A method of manufacturing a light emitting device, comprising:

forming light emitting devices on a support portion, each of the light emitting devices including first to third light emitting cells respectively emitting light of different colors;

supplying test power to at least a portion of the light emitting devices;

acquiring an image from the light emitted from the light emitting devices to which the test power is supplied using an image sensor; and identifying normal light emitting devices of the portion of the light emitting devices by determining whether a defect is present in each of the light emitting devices of the portion of the light emitting devices by comparing the image acquired by the image sensor with a reference image, wherein the test power is independently supplied to the first to third light emitting cells, and wherein the step of determining whether the defect is present includes:

quantifying a relative ratio of at least one of color, brightness, and chroma, by comparing the image having been acquired with the reference image; and determining whether the ratio having been quantified is equal to or greater than a threshold ratio.

17. The method of manufacturing a light emitting device of claim 16, wherein the step of supplying test power includes sequentially supplying the test power to the first to third light emitting cells, and the step of acquiring an image includes acquiring the image with respect to each of the first to third light emitting cells.

18. The method of manufacturing a light emitting device of claim 16, wherein, in the step of determining whether the defect is present, whether the defect is present is determined by relative physical quantities.

19. A method of manufacturing a light emitting device, comprising:

forming light emitting devices on a support portion;

supplying test power to at least a portion of the light emitting devices using a multi-probe;

acquiring an image from the light emitted from the portion of the light emitting devices to which the test power is supplied using an image sensor;

identifying normal light emitting devices of the portion of the light emitting devices by determining whether a defect is present in each of the light emitting devices of the portion of the light emitting devices by comparing the image acquired by the image sensor with a reference image; and based on the identifying step, measuring optical characteristics in terms of absolute physical quantities of each of the light emitting devices identified as normal of the portion of the light emitting devices, wherein the step of determining whether the defect is present includes:

quantifying a relative ratio of at least one of color, brightness, and chroma, by comparing the image having been acquired with the reference image; and determining whether the ratio having been quantified is equal to or greater than a threshold ratio.

* * * * *